United States Patent
Wang

(10) Patent No.: US 9,704,644 B2
(45) Date of Patent: Jul. 11, 2017

(54) FLEXIBLE CIRCUIT ASSEMBLY AND METHOD THEROF

(71) Applicant: James Jen-Ho Wang, Phoenix, AZ (US)

(72) Inventor: James Jen-Ho Wang, Phoenix, AZ (US)

(*) Notice: Subject to any disclaimer, the term of this patent is extended or adjusted under 35 U.S.C. 154(b) by 0 days.

(21) Appl. No.: 14/531,079

(22) Filed: Nov. 3, 2014

(65) Prior Publication Data

US 2016/0126010 A1 May 5, 2016

(51) Int. Cl.

| | |
|---|---|
| H05B 37/00 | (2006.01) |
| H05B 39/00 | (2006.01) |
| H05B 41/00 | (2006.01) |
| H01F 41/02 | (2006.01) |
| H05B 33/08 | (2006.01) |
| H05K 1/16 | (2006.01) |
| H05K 3/46 | (2006.01) |
| H05K 1/02 | (2006.01) |
| H05K 1/18 | (2006.01) |
| H05K 3/00 | (2006.01) |
| H05K 3/28 | (2006.01) |
| H05K 3/42 | (2006.01) |

(52) U.S. Cl.
CPC ..... *H01F 41/0206* (2013.01); *H05B 33/0803* (2013.01); *H05B 33/0821* (2013.01); *H05B 33/0845* (2013.01); *H05K 1/028* (2013.01); *H05K 1/0283* (2013.01); *H05K 1/165* (2013.01); *H05K 3/4697* (2013.01); *H05K 1/021* (2013.01); *H05K 1/0209* (2013.01); *H05K 1/0271* (2013.01); *H05K 1/189* (2013.01); *H05K 3/0005* (2013.01); *H05K 3/0035* (2013.01); *H05K 3/0061* (2013.01); *H05K 3/0097* (2013.01); *H05K 3/281* (2013.01); *H05K 3/427* (2013.01); *H05K 2201/056* (2013.01); *H05K 2201/086* (2013.01); *H05K 2201/0919* (2013.01); *H05K 2201/09672* (2013.01); *H05K 2201/09709* (2013.01); *H05K 2201/09845* (2013.01); *H05K 2203/0126* (2013.01); *H05K 2203/0384* (2013.01); *H05K 2203/0571* (2013.01); *H05K 2203/063* (2013.01); *H05K 2203/1545* (2013.01)

(58) Field of Classification Search
CPC ............ H01F 41/0206; H05B 33/0803; H05B 33/0821; H05B 33/0845; H05K 1/028; H05K 1/165; H05K 1/021; H05K 1/0271
USPC ....................................... 315/184–193, 185 S
See application file for complete search history.

(56) References Cited

U.S. PATENT DOCUMENTS

| | | | | |
|---|---|---|---|---|
| 2008/0036394 A1* | 2/2008 | Kim | ................... | H01F 27/2804 |
| | | | | 315/282 |
| 2011/0284761 A1* | 11/2011 | Balakin | ................... | A61N 5/10 |
| | | | | 250/396 R |
| 2012/0320532 A1* | 12/2012 | Wang | ................... | H05K 1/189 |
| | | | | 361/720 |

(Continued)

*Primary Examiner* — Brandon S Cole
(74) *Attorney, Agent, or Firm* — Edward James Mischen

(57) ABSTRACT

An embedded device 105 is assembled within a flexible circuit assembly 30 with the embedded device mid-plane intentionally located in proximity to the flexible circuit assembly central plane 115 to minimize stress effects on the embedded device. The opening 18, for the embedded device, is enlarged in an intermediate layer 10 to enhance flexibility of the flexible circuit assembly.

15 Claims, 14 Drawing Sheets

(56) References Cited

U.S. PATENT DOCUMENTS

2014/0268780 A1\* 9/2014 Wang .................... F21V 19/003
362/249.06

\* cited by examiner

FLEXIBLE CIRCUIT ASSEMBLY AND METHOD THEROF

The present application is a divisional application of U.S. patent application Ser. No. 13/506,110 filed on Mar. 27, 2012, by James Jen-Ho Wang., titled "Flexible Circuit Assembly and Method Thereof" which is hereby incorporated by reference in its entirety, and priority thereto for common subject matter is hereby claimed.

BACKGROUND OF THE INVENTION

The present invention relates generally to flex circuits and rigid flex circuits, and more particularly to the embedding of devices into flex circuits and rigid flex circuits.

Flex and rigid flex circuits are used extensively in applications, including automotive, computers and peripherals, small consumer devices, medical electronics, telecommunications, military, and aerospace, where space utilization and weight are a premium.

Flex circuitry incorporates metal lines sandwiched between non-conductive flexible layers to save space in routing of metal interconnect lines. However, as more layers of metal and non-conductive substrates are added to the sandwich, the flex circuit becomes less flexible. Attempts to add electrical or electronic devices require the mounting of components onto the surfaces of a flex sandwich. The surface mounted components, i.e., surface mounted devices (SMDs), make the flex circuit even more rigid and less flexible.

Electronic systems are often separated onto two or three circuit boards. Rigid printed circuit boards (PCBs) are used to mount and support the electronic devices and include many copper layers to interconnect the respective SMDs. Separate flexible interconnects are used to provide interconnection between the rigid PCBs. Flexible circuits are typically structured with two or more metal layers. Thus, the system is somewhat flexible in the interconnect flex circuit regions, but rigid where components are mounted. Therefore, the multi-component system is not optimized for size and weight parameters.

Furthermore, the combined PCB-flex manufacturing processes are complex. Rigid flex technology employs methods to thicken and stiffen a region of the flexible circuit to provide a region that is mechanically rigid to accommodate fragile components, e.g., surface mount devices and through hole connectors.

The process for inclusion of SMDs is likewise complex and less cost effective. For example, over-molding of devices such as semiconductor circuits, require additional assembly and packaging process steps. A component device, e.g., a light emitting diode (LED), likewise is diced from a wafer, assembled into a packaged device, and the packaged device is then mounted to a PCB to complete assembly.

In addition, the aforementioned PCB substrates are poor conductors of heat. Therefore, when heat generated by the mounted device is excessive, e.g., in the case of LEDs, power circuits, microprocessors, etc., more expensive thermally conductive substrates accompanied with the attachment of a bulky conducting heat sink are required. The heat sink is attached to the underside of metal core substrate, PCB, or on top of the packaged SMD to transfer the heat away from the mounted device. The heat sink is typically metallic copper or aluminum and its attachment to the substrate or package make the assembly bulky, heavy, and inflexible.

Therefore, what is needed is an ultra flexible flex process technology that permits mounting of an increased number of devices in a cost effective weight and space saving manner, transfers heat efficiently away from heat generating devices, and incorporates highly effectual automated roll-to-roll manufacturing concepts.

SUMMARY OF THE INVENTION

Figure 1:
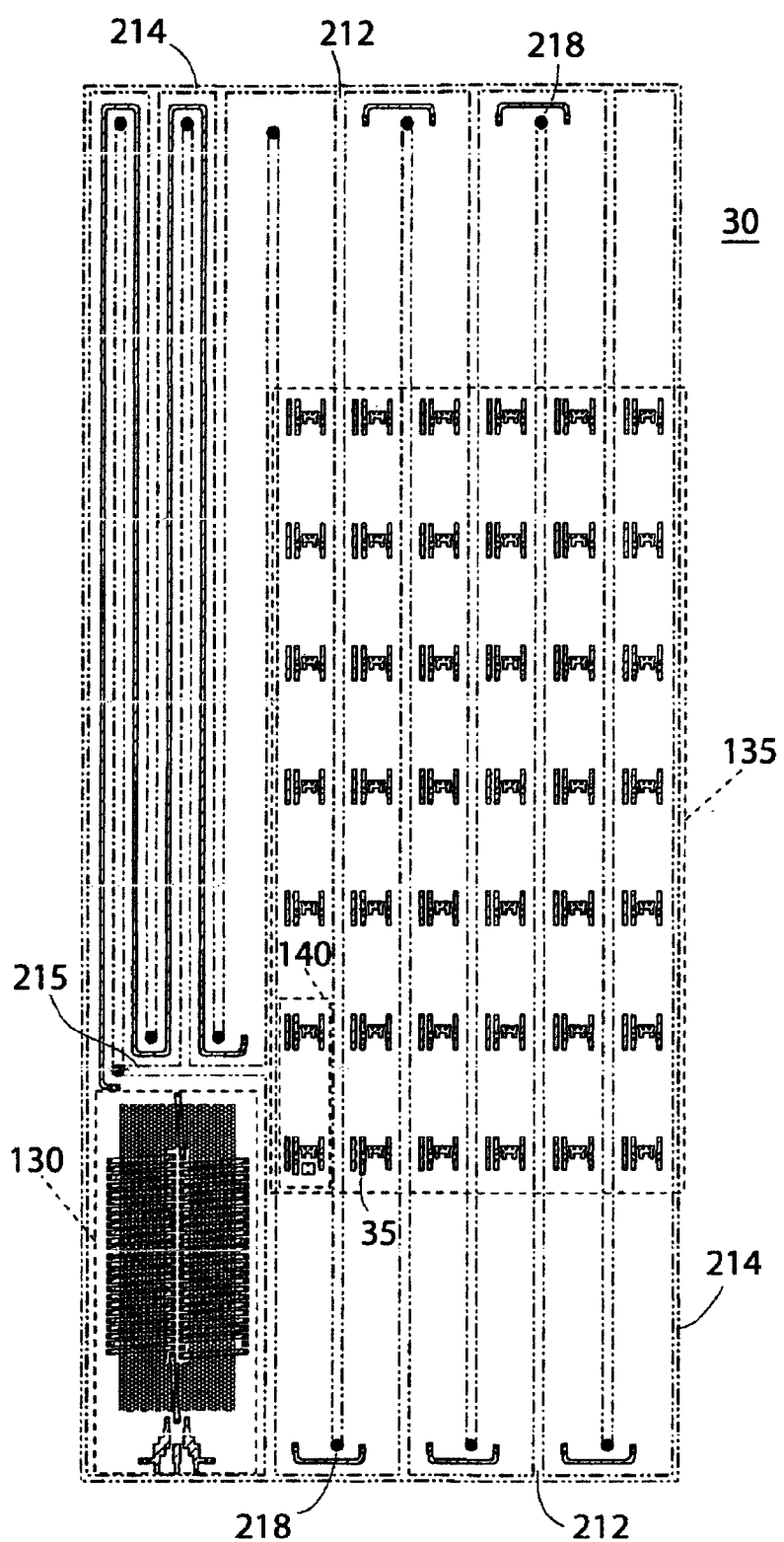
FIG. 1 illustrates a top view of a flexible assembly in accordance with an embodiment of the present invention.

In accordance with an embodiment, a method for fabricating a cost effective ultra flexible circuit assembly that accommodates efficient reduced stress, with reduced space requirements and enhanced heat transfer is provided.

In accordance with another embodiment, circuit flexibility of an assembly is enhanced by removing material from a non-conductive intermediate layer, from conductive layers, and from other non-conductive layers in the flexible circuit assembly. Additional material is removed from the intermediate and other layers, to facilitate openings through which components are attached (embedded) and to further enhance flexibility within the highly flexible substrate.

The intermediate layer of non-conductive material and other layers are patterned with a number of openings. The openings define areas for component mounting, areas for enhanced flexibility, and areas for stress relief. The openings also function to define target areas for "pick and place" type manufacturing operations. The non-conductive intermediate layer is attached with adhesive to a thin and highly flexible layer of material, e.g., copper on polyimide. Electronic components, electronic devices, and passive devices are then affixed to the highly flexible material, and embedded in the intermediate layer openings. Interconnecting top and bottom conductive layers are affixed and patterned as required to complete circuit connections. Interconnect from and to the embedded devices is implemented through utilization of wire bonding, tape automated bonding (TAB), and/or solder attachment. The completed assembly is covered with protective coatings.

In accordance with an aspect, a method for fabricating an assembly of electronic and electric devices, along with corresponding interconnects, that exhibits highly flexible characteristics is provided.

In accordance with another aspect, electronic and electrical devices and components, both active and passive, in the flexible assembly in a cost effective manner are provided.

In accordance with another aspect, the number of processes and the amount of raw materials required to complete the flexible assembly is minimized.

In accordance with another aspect, a flexible assembly of electronic and electric devices that exhibits enhanced heat dissipation characteristics is produced.

In accordance with another aspect, a flexible assembly of electronic and electric devices that exhibits reduced stress characteristics is produced.

In accordance with another aspect, a highly flexible electronic and electrical device assembly that exhibits reduced weight characteristics is provided.

In accordance with another aspect, a highly flexible electronic and electrical device assembly that is completely compatible with automated techniques is provided.

In accordance with another aspect, an inductor structure that exhibits a magnetic field parallel to the plane of the flexible assembly is provided.

In accordance with another aspect, an inductor with a laminated core that exhibits reduced stress characteristics is provided.

In accordance with another aspect, an inductor and other electronic and electrical devices with three dimensional characteristics is provided.

In accordance with another aspect, a method of fabrication, within a flexible circuit assembly, that eliminates the need for packaging electronic and electrical devices prior to assembly of the flexible circuit assembly is provided.

In accordance with another aspect, a method for fabricating mechanically stable, thin, laminated magnetic cores having narrow air gaps is provided.

In accordance with another aspect, a completely integrated functioning LED lighting system in which the components are embedded within the same flexible circuit assembly is provided.

In accordance with another aspect, an integrated functioning LED lighting system that is powered directly from an alternating current (AC) source is provided.

DETAILED DESCRIPTION OF THE DRAWINGS

In accordance with an embodiment, a highly flexible circuit assembly suitable for use in a number of constrained form factor and limited space applications and ideally adapted for automated manufacturing techniques is provided.

Referring to FIG. 1, a top view of a flexible circuit assembly in accordance with an embodiment of the present invention is shown. Flexible circuit assembly 30 is configured with an inductor area 130, LED area 135, and surface metallization interconnect 35. LED area 135, for example, is an array of embedded circuits that is 6 wide by 7 deep. LED area 140 is contained within LED area 135. Further detail is omitted from FIG. 1 to provide a more simplified view of the flexible circuit assembly concept.

Figure 1A:
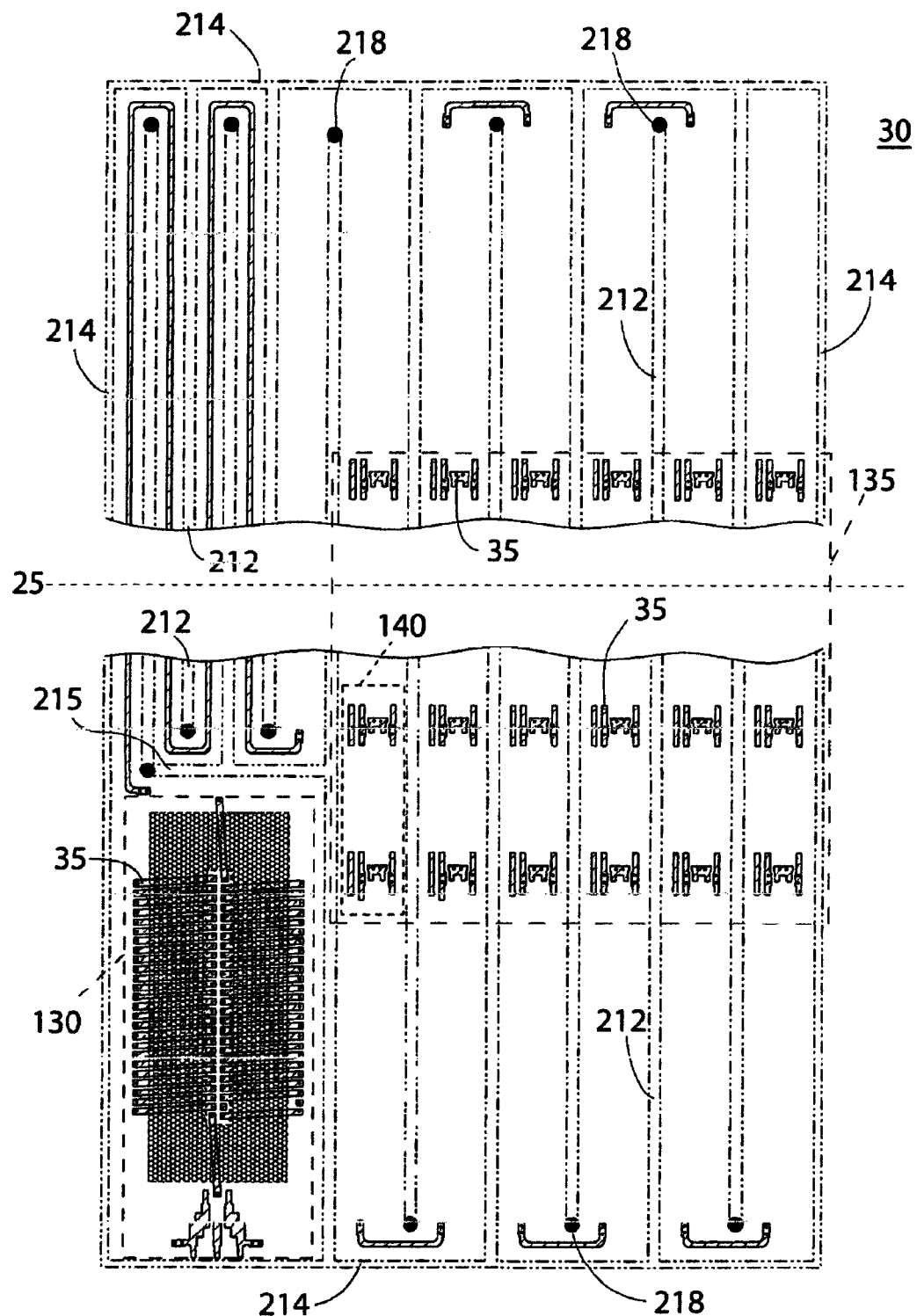
FIG. 1a illustrates a top view of the flexible assembly of FIG. 1 illustrating specific areas of interest for FIGS. 6-15.

Referring to FIG. 1a, the flexible circuit of FIG. 1 is shown enlarged and severed at break line 25 to provide more clarity as to the structure of the flexible circuit. Patterned metallization layer 35 includes diode metallization, inductor metallization, and interconnect metallization (all not annotated). The patterned metallization serves as a reference, for purpose of discussion, for location of internal cut lines 212 and 215, peripheral cut lines 214, and drill openings 218. The internal cut lines facilitate extension of flexible circuit assembly 30 into an ultra flexible circuit assembly of FIG. 21 and FIG. 22.

Figure 2:
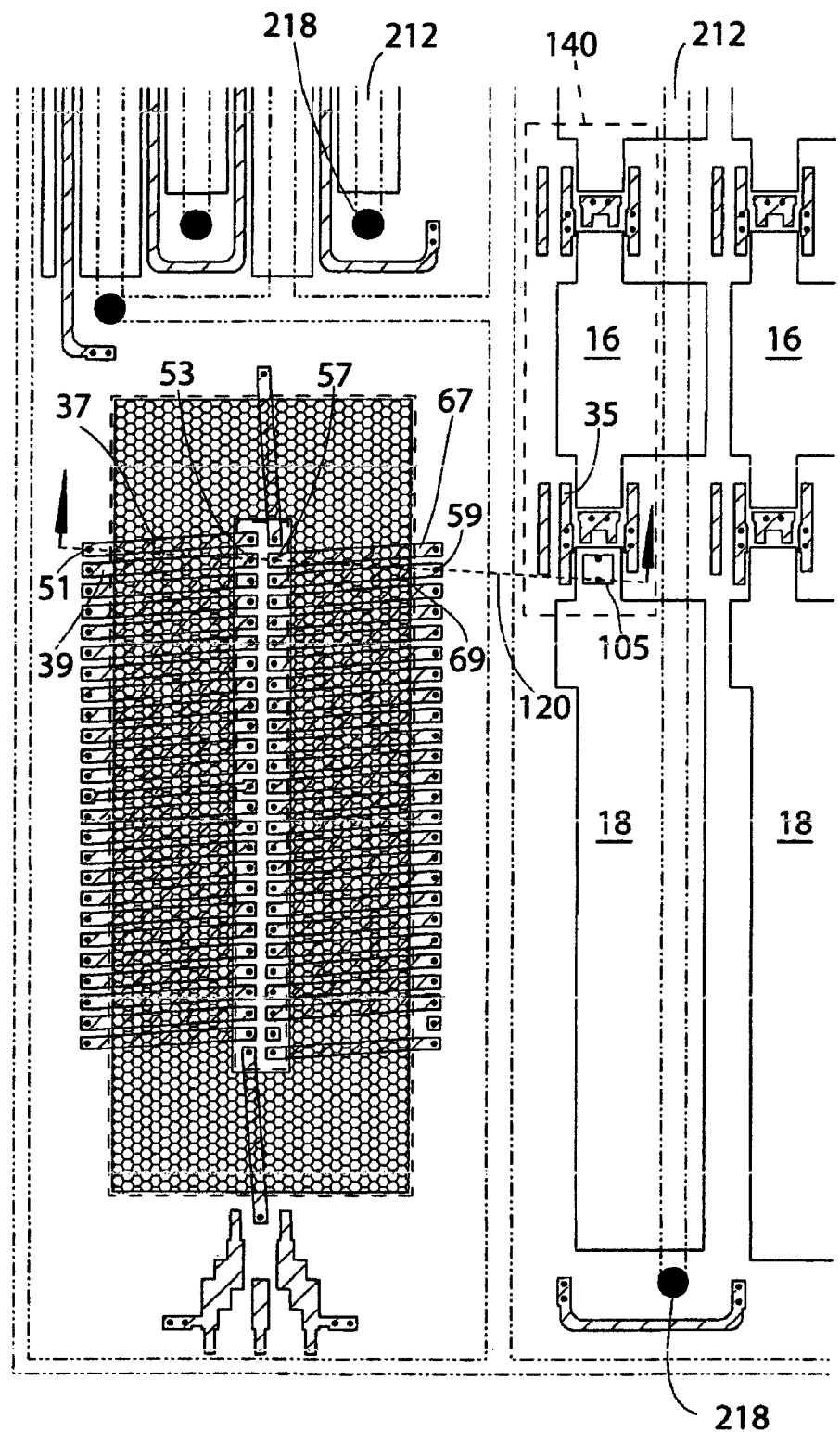
FIG. 2 illustrates a top view of a portion of FIG. 1 and further illustrates a cross-section relating to FIGS. 6-15.

Referring to FIG. 2, a portion of flexible circuit assembly 30 of FIG. 1, i.e., inductor area 130 and LED area 140, is expanded to provide more detail for cross-section 120. The cross-section intersects vias 51, 53, 57, 59, inductor winding metallizations 37, 39, 67, and 69, i.e., top windings, and LED chip (die) 105, to provide basis for cross-sectional views for FIGS. 6 through 15.

Figure 3:
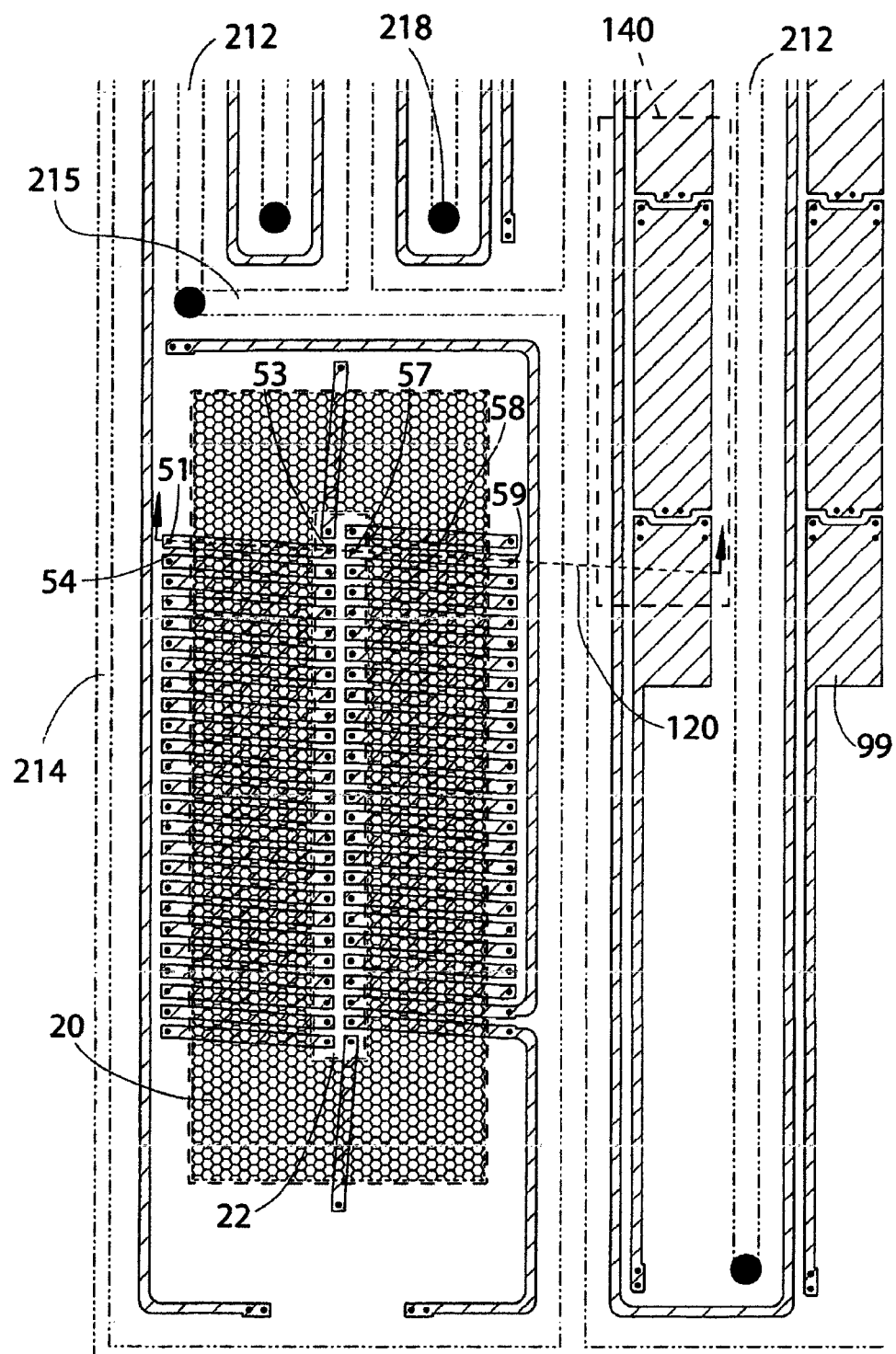
FIG. 3 illustrates a bottom view of a portion of FIG. 1 and further illustrates a cross-section relating to FIGS. 6-15.

Referring to FIG. 3, i.e., an under view of expanded FIG. 2, cross-section 120 intersects vias 51, 53, 57, 59, inductor winding metallizations 54 and 58, i.e., bottom windings, and LED chip 105 (not shown).

Figure 4:
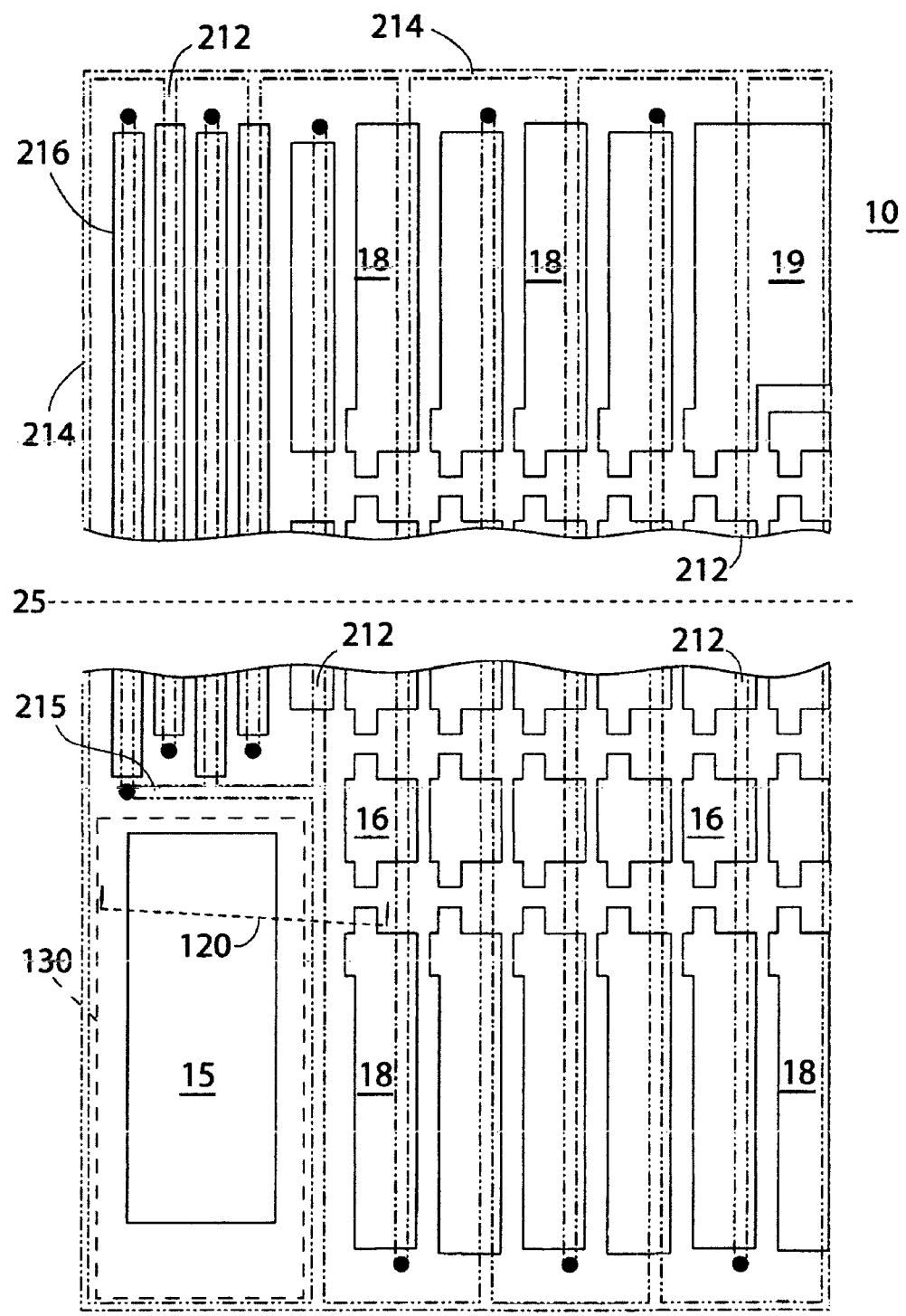
FIG. 4 illustrates top view of the cut and patterned intermediate layer of the flexible assembly of FIGS. 6-15.

Referring now to FIG. 4, a top view of intermediate layer 10 shows inductor opening 15, LED extended opening 18, LED openings 16, extended flex LED opening 19, and extended flex openings 216. Peripheral cut lines 214 and internal cut lines 212 and 215 are not defined within the intermediate layer, but are illustrated for purpose of reference location to the aforementioned openings. The cut lines may be defined using a CAD tool and router cut following completion of assembly steps for flexible circuit assembly 30, resulting in the ultra flexible structure of FIG. 21.

Figure 5:
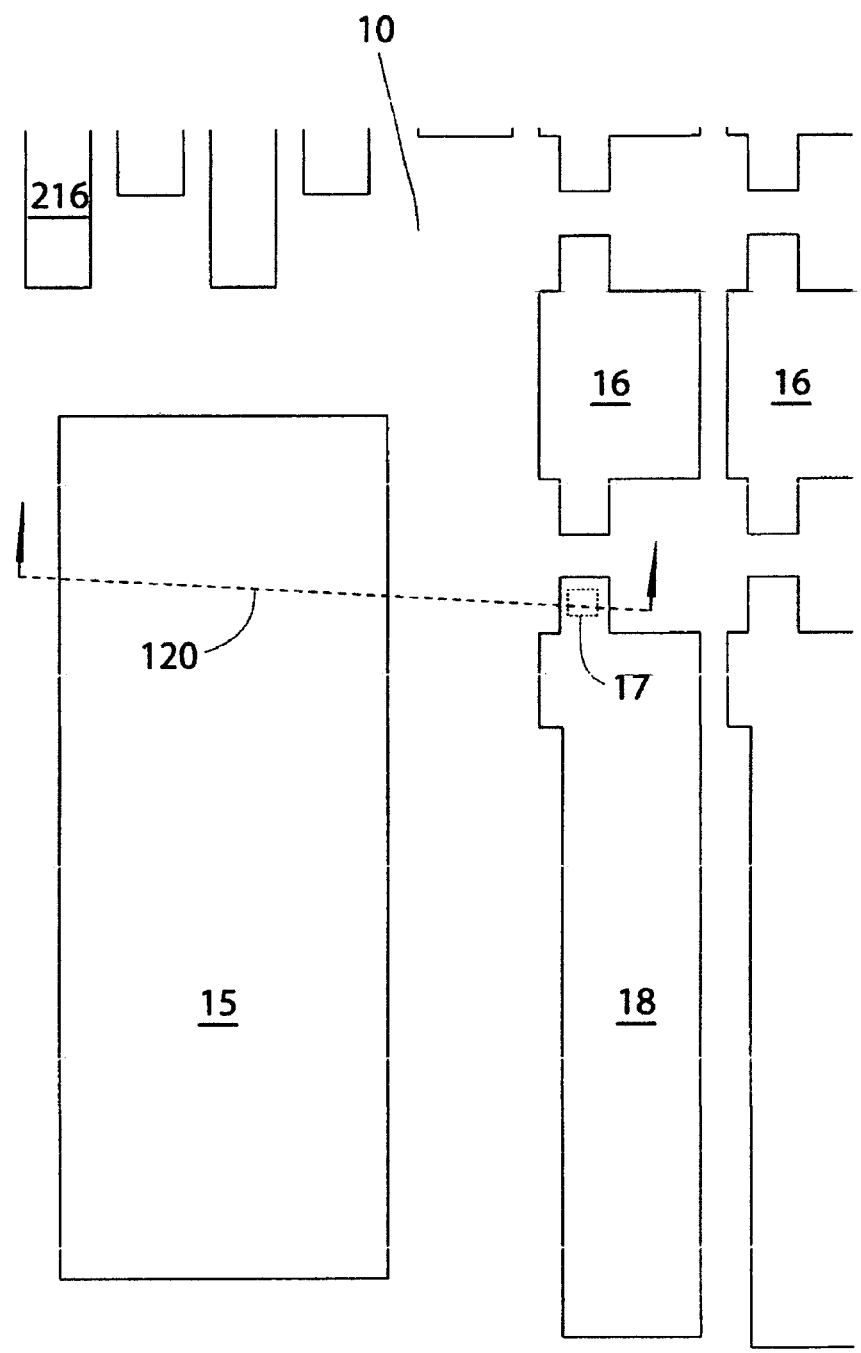
FIG. 5 illustrates a partial and expanded top view of the flexible assembly of FIG. 1 showing the patterned intermediate layer.

Referring now at FIG. 5, an expanded portion of intermediate layer 10 of FIG. 4 is shown In FIG. 5, inductor opening 15 and LED opening 18 are configured within intermediate layer 10. The openings may be pre-defined using, e.g., a CAD layout tool. Chip (die) target area 17 is predetermined to optimize placement of an LED chip (die) within the LED opening. For this example, due to the inflexible nature of a semiconductor LED chip, spaces between the intermediate layer walls and the LED chip are selected to be minimized on three sides to provide additional support and to reduce stress to the more rigid chip. The spaces, for this example are 0.13 mm. For the fourth side of the chip target, LED opening 18 is enlarged to provide an area of greater flexibility for flexible circuit assembly 30. Likewise, LED opening 16 is enlarged to facilitate its respective LED chip.

The configured openings are then cut, in intermediate layer 10 using a routing tool computer controlled by the CAD data file that was used to generate the intermediate layer pattern. Inductor opening 15 and LED openings 16 and 18 provide access for mounting of inductor and LED components, respectively, within the flexible circuit assembly. The openings may also serve as assembly alignment targets for automated assembly processes. One skilled in the art realizes that other methods are available to cut non-conductive and conductive layers. Other cutting methods include laser, knife blade, and stamping, or the like.

For this example, the openings are configured to be inductor and LED specific. However, one skilled in the art would recognize that other electrical, electronic, optical, mechanical, electro-mechanical, and electro-optical devices may be facilitated by the process.

The intermediate layer is, but is not limited to polyimide. Alternative dielectric type materials used for the intermediate layer, and for other non-conductive layers, are, but are not limited to, polyester-imide, aramid paper, mylar, polyethylene, polyvinylchloride, fiber reinforced epoxy, Teflon® FEP, and sandwiched layers of copper/flex circuits.

Figure 6:
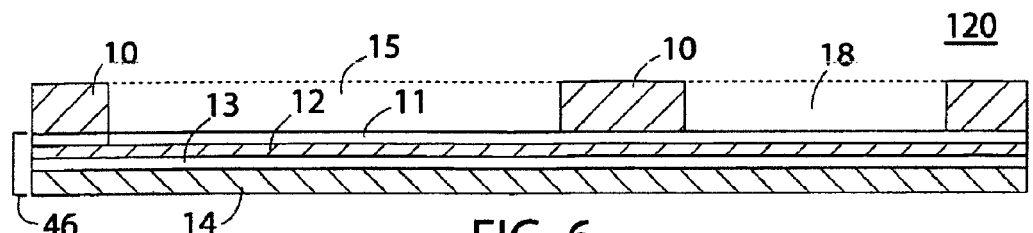
FIG. 6 illustrates a cross-sectional view of the flexible assembly of FIG. 1 showing the attachment configuration of the intermediate layer and a copper layer assembly.

Referring to FIG. 6, processing of flexible circuit structure 30 continues. Intermediate layer 10 is patterned and processed as described in the description for FIG. 5. A one-sided 0.025 mm thick dielectric film 12, having a 2 ounce copper layer 14 is first attached to the underside of intermediate layer 10 via adhesive layer 11. For this example, a thick one-sided dielectric film assembly is selected with adhesive layer 13 inherently present between thick dielectric film 12 and 2 ounce copper layer 14. Thus, the combination of copper layer 14, adhesive layer 13, thick dielectric film 12, and adhesive layer 11 forms film assembly structure 46.

Alternatively, the film assembly may be selected without the adhesive layer 13. This type of starting film assembly has copper layer 14 directly bonded to dielectric film 12. The resulting film assembly is thinner and therefore more flexible in nature.

For this example, the thickness of intermediate layer 10 is 0.127 mm with a typical range of 0.01 mm to 1.0 mm. Adhesive layers 11 and 13 are 0.051 mm and 0.025 mm respectively.

As one skilled in the art would recognize, thicknesses of copper, dielectric and adhesive vary with specific processes and with physical device characteristics and are not limited to above thicknesses. Conductive layers are, but are not limited to rolled copper and include such variations as conductive organic film, printed/sintered copper, sputtered on copper, electroplated copper, aluminum and steel.

Figure 7:
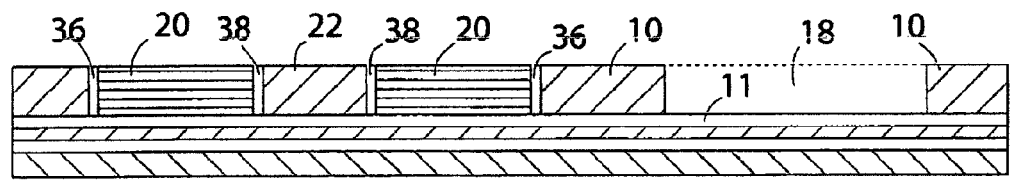
FIG. 7 illustrates a cross-sectional view of the flexible assembly of FIG. 1 showing an embedded magnetic core and embedded island configuration.

Looking now to FIG. 7, a pick and place equipment positions magnetic core 20 within inductor opening 15, and positions and centers island 22 within the magnetic core. Pressure and heat are applied over the magnetic core and island assembly to affix the inductor components to adhesive layer 11. The magnetic core and island are approximately of the same thickness as the intermediate layer to provide a planar surface for further processing of, e.g., interconnect layers. Island 22 is preferably the same material and same thickness as intermediate layer 10.

One skilled in the art can appreciate that both intermediate layer 10 and island 22 closely match the thickness of magnetic core 20 which, for example, can range from 0.02 mm thick for a single layer magnetic core to a thickness of over 1.0 mm for a stacked laminated core. A thicker core provides capability for handling more electrical power, but results in decreased flexibility and adds weight to the flexible assembly.

Figure 8:
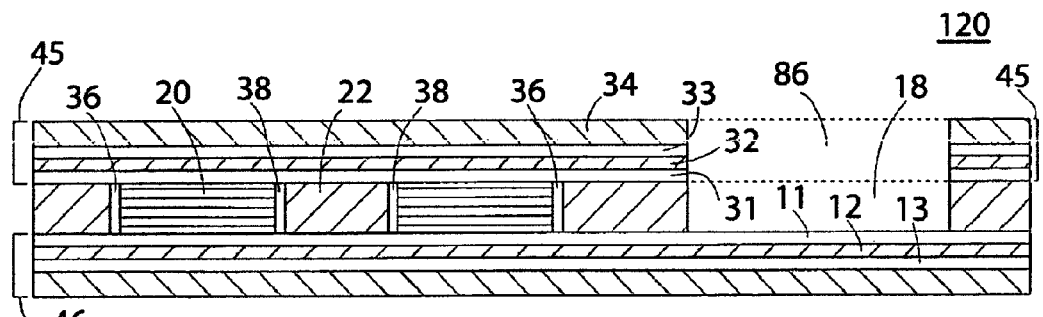
FIG. 8 illustrates a cross-sectional view of the flexible assembly of FIG. 1 showing a cut copper lamination assembly attachment to the intermediate layer assembly in accordance with an embodiment of the present invention.

Referring now to FIG. 8, copper layer 34 is affixed to one-sided dielectric film 32, via adhesive layer 33 that is inherent to the one-sided dielectric film, and adhesive layer 31 to form structure 45. One skilled in the art would ascertain that various combinations of metal adhesive and non-conductive films are available to configure stack 45.

The stack is router cut, in a process similar to that of the intermediate layer, using the appropriate CAD data file to drive the router cutting tool. The referenced router cut presents opening 86 in the stack to provide access to LED opening 18, the openings are concurrently placed to facilitate embedding of the LED chip (die).

For this example, one-sided dielectric layer 32 is 0.025 mm thick, having a 2 ounce copper layer 34. Adhesive layers 31 and 33 are 0.051 mm 0.025 mm, respectively.

Thicknesses of copper, dielectric and adhesive may vary to accommodate characteristics and requirements of specific processes and are not limited to references cited in the preceding example. Conductive layers are, but are not limited to rolled copper and include such variations as conductive organic film, printed/sintered copper, sputtered on copper, electroplated copper and aluminum.

A lamination process is used to affix structure 45 to the flexible circuit structure of FIG. 7.

The lamination process utilizes a mechanically pressurized baking step to cure adhesive layers 11, 13, 31 and 33. Pressurized cure under atmosphere or vacuum, plus bake methods used for this process, are known to those skilled in the art.

As a result of the lamination process, magnetic core 20 and island 22 are now sandwiched between dielectric film 32 and dielectric film 12. Core space 36, between intermediate layer 10 and magnetic core 20; and island space, 38 between magnetic core 20 and island 22, will be at least partially, if not completely filled in by the adhesive layers 11 and 31 squeezing into both spaces. The degree of filling is dictated by material dimensions and by lamination process parameters, e.g., pressure and heat.

As one skilled in the art would recognize, the provided LED opening 18, for this example, does not imply a limitation only to the assembly of LEDs in combination with inductors, and alternatively may be used for assembly of device types other than LEDs and inductors.

Figure 9:
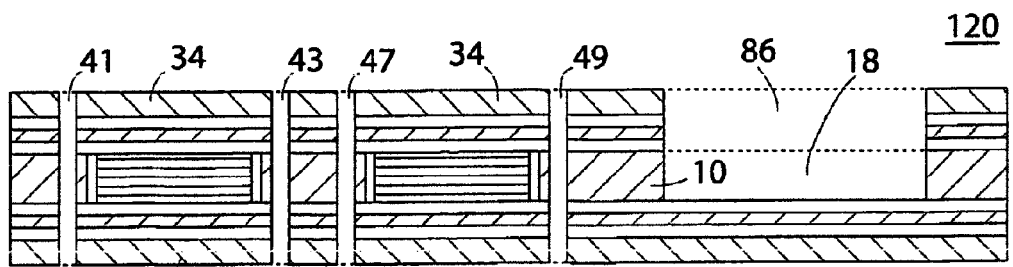
FIG. 9 illustrates a cross-sectional view of the flexible assembly of FIG. 1 showing via openings.

Referring now to FIG. 9, via openings 41, 43, 47, and 49 are configured by a drilling process that is controlled by data from a CAD file. The vias, for this example, provide access to copper layer 14 and to copper layer 34 to facilitate interconnect of the inductor windings shown in FIG. 1.

Figure 10:
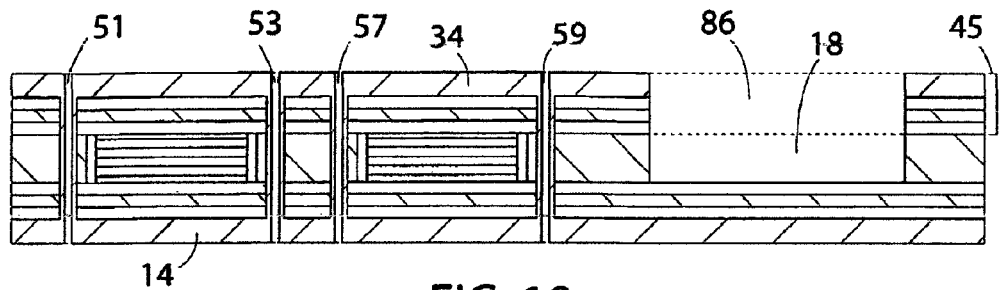
FIG. 10 illustrates a cross-sectional view of the flexible assembly of FIG. 1 showing via openings after plating process.

Referring now to FIG. 10, via openings 41, 43, 47, and 49 are plated to form plated vias 51, 53, 55, and 57. The plated vias serve as a vehicle for interconnecting metallization patterns within the flexible circuit assembly. For this example, the plated vias couple the windings of the embedded inductor.

Cleaning and/or activation steps common to flex manufacturing for via plating are known to those skilled in the art and are not described here. Copper plating of via openings is, but is not limited to an electro-less process, an electrolytic process, or a combination of both.

Figure 11:
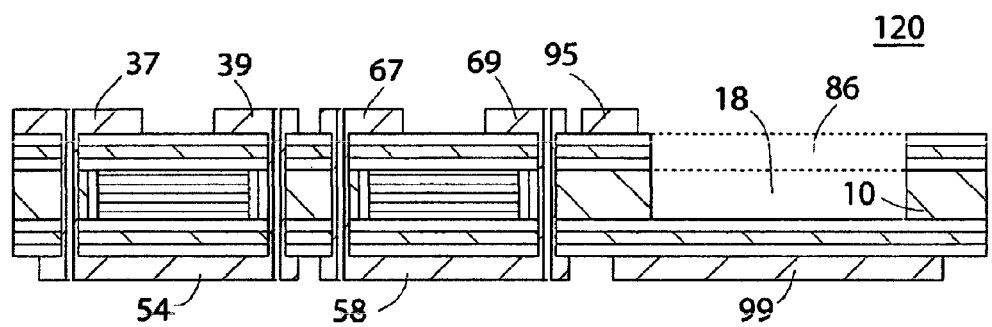
FIG. 11 illustrates a cross-sectional view of the flexible assembly of FIG. 1 showing patterned and etched copper layers.

Looking now to FIG. 11, copper layer 34 and copper layer 14, of FIG. 10, are configured with patterns defined by two dry film masks, respectively. A photosensitive film is applied to copper layer 34. The respective mask is aligned to the via layer. The photosensitive film is exposed to UV light, through metal layer predetermined defined openings in the mask. The dry film is then chemically developed to form the desired patterns.

Likewise, a photosensitive film is applied to copper layer 14, of FIG. 10. The respective mask is aligned to the via layer. The photosensitive film is exposed to UV light, through the metal layer defined openings in the mask. The dry film is then chemically developed to form the predetermined etch patterns.

Next the dry film masked metallizations are immersed to chemically etch both copper layers 34 and 14. After etching of the copper layers, the dry film masks are removed. The resulting metallization patterns are inductor winding metallizations 37, 39, and 54; inductor winding metallizations 67, 69, and 58; and wire bond copper pad 95. The inductor metallization patterns are also shown in FIGS. 1 through 3.

Figure 12:
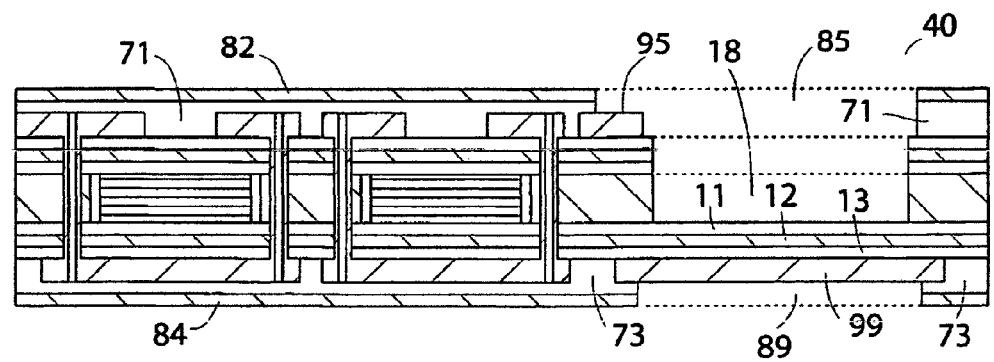
FIG. 12 illustrates a cross-sectional view of the flexible assembly of FIG. 1 showing cuts and lamination of cover layers.

Referring now to FIG. 12, coverlay layer 82, with attached adhesive layer 71, is router cut to create opening 85 and then attached to the assembly of FIG. 11. For this example, the coverlay layer is 0.025 mm thick polyimide, and the adhesive layer is 0.05 mm. Alternatively, other dielectric materials, e.g., solder mask and/or adhesives known to those skilled in the art may be used for the coverlay. Pressure, or alternatively pressure and heat, is used to affix the coverlay structure to the assembly of FIG. 11.

Likewise, coverlay layer 84, with attached adhesive layer 73, is router cut and affixed to the assembly of FIG. 11 using adhesive layer 73. The coverlay layer is 0.025 mm thick polyimide, and the adhesive layer is 0.05 mm.

The coverlay serves to insulate and to protect the underlying metallization patterns from exposure to external environments and also as a target for exposing areas for further processing. In FIG. 12, coverlay layer 82 is configured to expose copper pad 95 and LED opening 18 and expanded LED opening 85. Coverlay layer 84 performs the corresponding function for underlying metallization and for opening 89 for exposure to copper flag 99.

Coverlays are cut using a computer controlled router. A CAD file is configured to drive the router to remove the respective coverlay polyimide and adhesive material to form the openings 85 and 89.

Figure 13:
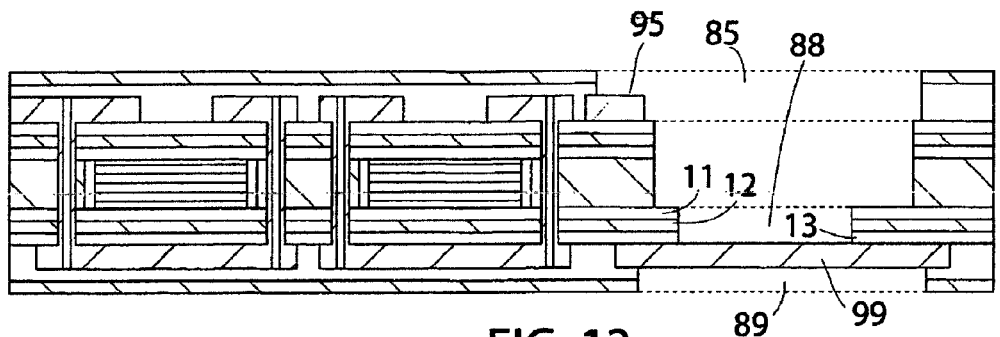
FIG. 13 illustrates a cross-sectional view of the flexible assembly of FIG. 1 showing detail after laser skiving of the LED opening and after the electroplating process.

Referring now to FIG. 13, embedding heat generating devices, such as LED 105, within flexible circuit assemblies, requires an effective method for transferring the heat from the device, in order to maintain a thermal gradient that will not cause damage to the device. Additionally, it is beneficial to reduce mechanical stresses seen by embedded devices to accommodate a higher degree of flexibility within the assembly. In FIG. 13, an optimal solution is provided for embedded component heat transfer and stress reduction for flexible circuit assembly 10.

A predetermined area of adhesive 11, dielectric film 12, and adhesive 13 of FIG. 12, is removed by a laser skiving process, thus providing a device placement opening. The removal of skive area opening 88 is accomplished, for example, by a laser cutting tool. The tool is computer driven from a CAD data file, programmed for the predetermined skive area. The laser power level is set to remove organic films while leaving copper materials intact.

The layers are removed, exposing copper flag 99 in skive area opening 88. The copper flag serves as laser etch stop during the laser skiving process and seals the bottom side of the LED opening. The total chip (die) opening of LED opening 18, coverlay opening 85, and skive area opening 88, is designed to provide easy access, to the now exposed copper flag, for placement of the embedded device.

Additionally for this example, copper chip (die) bond pad 95 and copper flag 99 are pre-cleaned, followed by plating of nickel and gold onto the exposed copper surfaces. Plating on the exposed copper promotes wire bond quality and corrosion resistance. One skilled in the art realizes the plated copper surface may also be configured for tape automated bonding (TAB). Plating compositions are, for example, but not limited to NiPdAu, NiPd, Au and CrAu. Alternatively, copper surfaces may remain unplated, for solder attachment applications.

Figure 14:
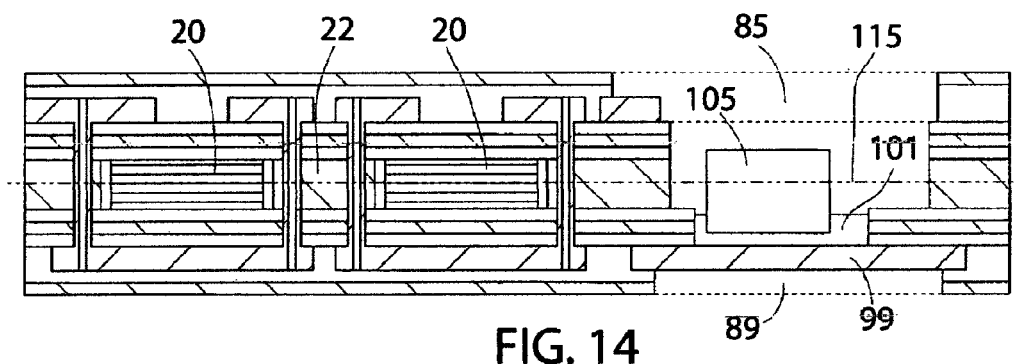
FIG. 14 illustrates a cross-sectional view of the flexible assembly of FIG. 1 showing chip (die) attach.

Looking now to FIG. 14, thermally conductive epoxy adhesive 101 is dispensed into skive area opening 88 and onto copper flag 99. For this example, LED chip (die) 105 contacts, e.g., gold, are both on the upper chip (die) surface, thus negating the need for a backside electrical chip (die) contact. The adhesive is, but is not limited to for example, diamond filled epoxy, and other compositions containing filler materials of either silver flakes, alumina, particles, or nano-fibers.

Alternatively, should a backside electrical chip (die) contact be required, an electrically conductive epoxy may be used, or tape automated bonding or solder die attach may be employed.

Copper flag 99 may be configured as an interface to other electrical components within the flexible circuit assembly. Additionally, a heat sink medium can also be affixed to the copper flag through coverlay opening 89 to accommodate more rapid heat transfer as required by an embedded device.

LED chip (die) 105 is accurately placed inside LED opening and over the epoxy adhesive using an automated die (chip) pick and place equipment. The completed assembly is next subjected to a heat, or alternatively an ultraviolet (UV) cure cycle to firmly attach the LED chip (die) to the copper flag.

Looking further to FIG. 14, central plane 115 intersects the embedded structures, i.e., LED chip (die) 105, inductor magnetic core 20, and island 22. The central plane is a plane of least stress for the flexible circuit assembly. Mechanical stresses are reduced greatly by placing the embedded devices adjacent to or intersecting the central plane, i.e., in proximity to the central plane. Alternatively, for example, a mid-plane (not shown) is defined as a plane that lies between the top surface and bottom surface of the device, and approximately bisects the embedded device. The placement of the mid-plane in proximity to central plane 115 minimizes the mechanical stress on the embedded device.

The central plane is a plane of zero stress when flexible circuit assembly 30 is subjected to bending. For this example, where layers located above the central plane are equivalent in number, thickness, structure, and composition to layers located below the central plane, i.e., symmetrical, the central plane is physically located at the center of the aforementioned layers.

Where layers of the flexible circuit are not symmetrical, e.g., different in numbers, thicknesses, structure, or composition, a computer generated stress analysis program is used to determine the location of the central plane. Correspondingly, the flexible circuit is designed to embed components and devices to intersect, or to be located in proximity to (adjacent to) the central plane, in a predetermined manner, therefore minimizing stress effects within the flexible circuit.

Figure 15:
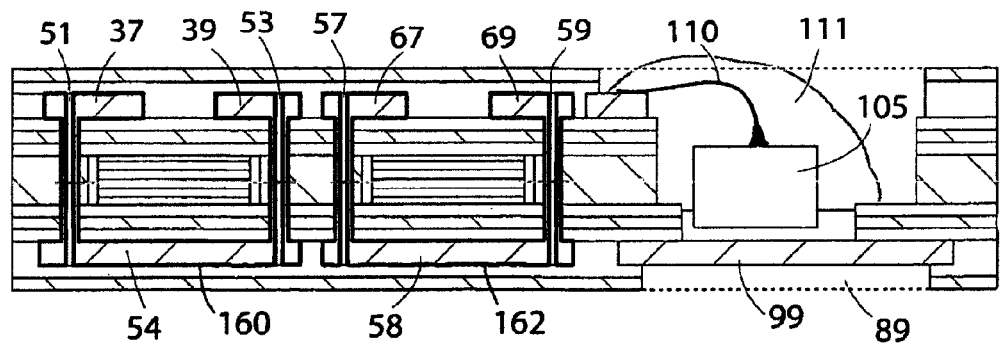
FIG. 15 illustrates a cross-sectional view of the flexible assembly of FIG. 1 showing chip (die) wire bond, encapsulation, and inductor loop path.

Looking now to FIG. 15 gold wire 110 is ball bonded to LED chip (die) 105, and wedge bonded to copper bond pad 95 to complete the bonded chip (die) assembly. Following the bonding process, the bonded chip (die) assembly is encapsulated using, for example, optically transparent encapsulant 111. The encapsulant is dispensed on the LED chip (die), the wire bonds, and copper bond pad to protect the assembly. The encapsulant also aids in guiding radiated light from the LED chip (die). Florescent powder maybe added on surface of the LED chip (die) or mixed into the encapsulant to alter visible color of radiated light.

The encapsulant, for this example, is a silicone based gel, but alternatively is, but is not limited to, grease and over-molding compounds, both silicone based and non-silicone based. In certain applications, phosphor particles embedded within the encapsulant are used to convert blue or UV LED light to yellow, green and red light Again looking to FIG. 15, and in conjunction with FIG. 2 and FIG. 3, the three dimensional aspect of inductor wire loops 160 and 162 becomes evident. The inductor loops are wound in a three dimensional pattern, including inductor wire metallizations 37, 54, 39, 67, 58, and 69, to form the inductor loops. Furthermore, the resulting inductor loops generate lateral magnetic fields parallel to central plane 115 of the flexible circuit assembly and are therefore confined mostly within the magnetic core, thus reducing the effect of the stray field lines on components and metallization patterns located on adjacent or near adjacent layers of the assembly. This is particular importance in reducing the impact of stray electromagnetic interference (EMI) effects when considering a flexible circuit assembly with multilayer metal configurations and sensitive electronic components.

Incorporating the processes of FIGS. 6 through 15, the flexible circuit assembly of FIG. 1, results in a singulated flexible circuit assembly of dimensions 78 mm wide×183 mm long×0.8 mm thick. The measured weight of the singulated assembly, including LEDs, encapsulant, and inductor with steel core, is 9 grams.

The inductor of FIG. 1, is 15 mm wide×40.3 long×0.11 mm thick, with a core opening of 2.8 mm×28.1 mm. The inductor exhibits an inductance value of approximately 350 micro Henries, measured at 60 hertz.

As one skilled in the art would recognize, the concepts represented above in FIGS. 6 through 15, although referenced to inductors, can equally be applied to transformer circuit elements, and do not deter from the spirit of the invention.

Figure 16:
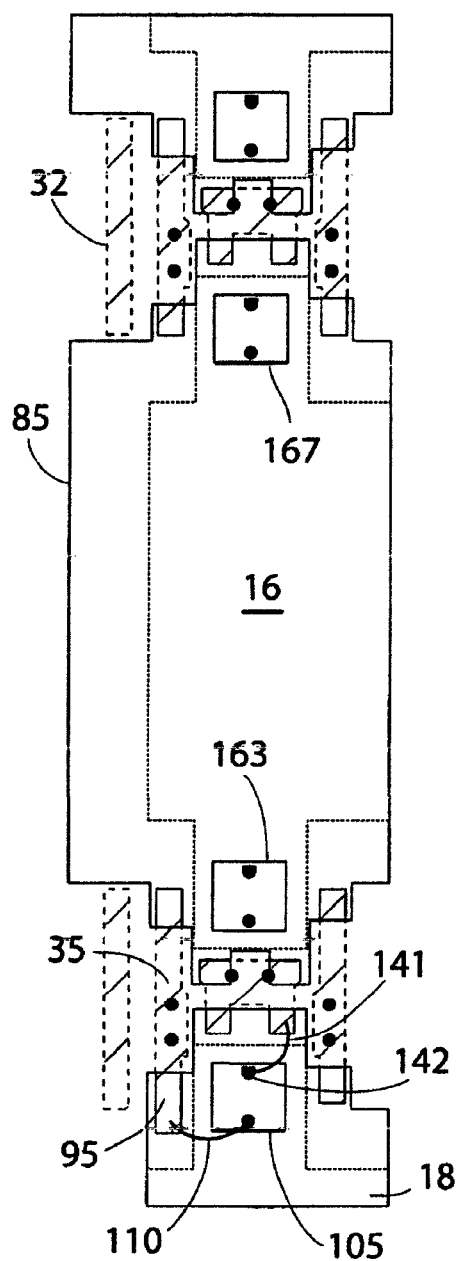
FIG. 16 illustrates a top view of the flexible assembly of FIG. 1 showing further detail of the LED openings for the completed flexible assembly.

Referring to FIG. 16, a portion of the completed flexible circuit assembly is shown. LED opening 16 lies adjacent to LED openings 18, and like LED openings 18, is similarly elongated to facilitate enhanced flexibility of flexible circuit assembly 30 of FIG. 1 and to provide stress relief for embedded components. LED chip (die) 105, 163, and 167 are placed in the respective openings in close proximity to three sides of the openings to provide mechanical support for the respective LED chip (die). Coverlay opening 85 exposes the respective LED openings to facilitate ease of LED device assembly and to enhance flexibility within the flexible circuit assembly.

For simplicity, only the wire bond detail for LED chip (die) 105 is shown in FIG. 16. For this example, LED chip (die) are configured with both anode and cathode connections on the same surface of the chip (die). The anode of LED chip (die) 105 is coupled to wire bond pad 95 through bond wire 110. The cathode of the LED chip (die) is coupled to wire bond pad 142 through bond wire 141. Alternatively, the LED chip (die) anode and cathode can be disposed on opposite sides of the chip (die), wherein one connection is wire bonded to a wire bond pad and the second connection is made to a copper flag of the flexible circuit assembly, such as copper flag 99 of FIG. 17. Additionally, anode and cathode connections can be made using thermal bumps on the LED chip (die). The LED chip (die) is then TAB or flip-chip bonded to segmented copper flags (not shown) in the flexible circuit assembly.

Figure 17:
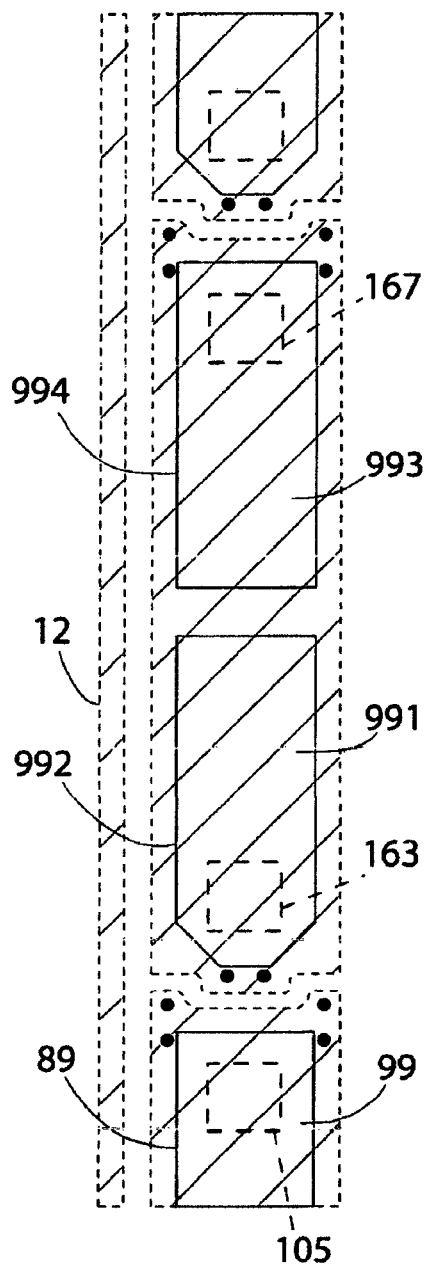
FIG. 17 illustrates a bottom view of the flexible assembly of FIG. 16.

Referring to FIG. 17, a bottom view of FIG. 16 is shown. LED chip (die) 105, 163, and 167 are mounted to copper flags 99, 991, and 993, respectively, as described in the process for FIGS. 6 through 15. The copper flags are patterned in an enlarged configuration to facilitate enhanced thermal transfer away from the LED chips (dies). Coverlay openings 89, 992, and 994, provide access to the copper flags, for example, to permit air flow for cooling or for attachment of heat sinks to improve thermal transfer characteristics of the LED chip (die).

Figure 18:
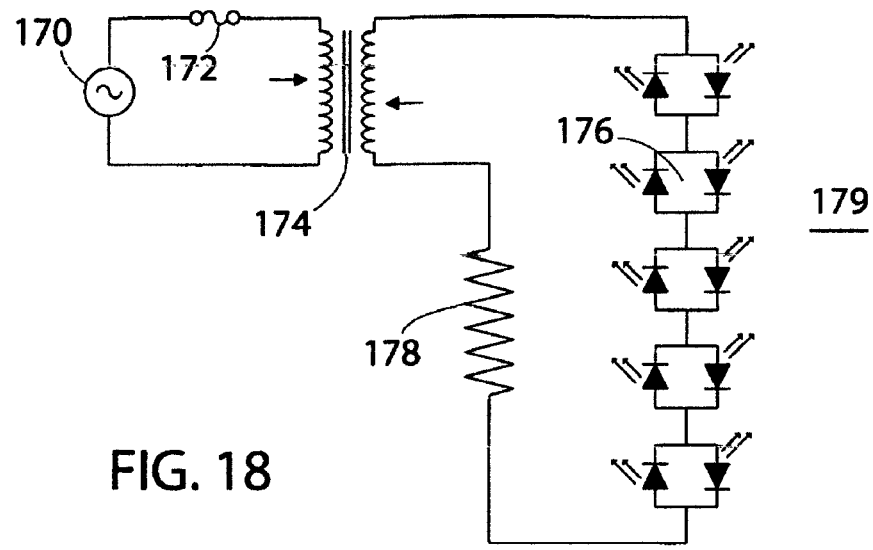
FIG. 18 illustrates a circuit diagram of the flexible assembly showing an AC LED implementation in accordance with another embodiment of the present invention.

Referring to FIG. 18, an application of the present flexible circuit assembly invention is shown, incorporating 60 Hertz AC power source 170 to directly drive an LED lighting configuration. The AC power source is connected to LED string 179, through fuse 172, and transformer 174. The transformer is fabricated as an embedded device, utilizing the flexible circuit assembly process described in FIGS. 6 through 15. As one skilled in the art would recognize, a transformer is an assembly of interspersed inductor windings. Thus, the inductors of the present invention are used to fabricate the embedded transformer.

LED string 179 is fabricated from serially connected back to front LED pairs 176. The secondary of transformer 174 is coupled to the LED string, at one end, through current limiting resistor 178, to the second end of the LED string.

Typically, for a 60 Hertz AC power source, powering an LED produces noticeable flicker. By incorporating the LEDs in a back to back configuration, the LEDs operate in an efficient manner when AC current flows in either direction. Thus, the circuit operates in a mode equivalent to 120 Hertz, reducing noticeable flicker.

Figure 19:
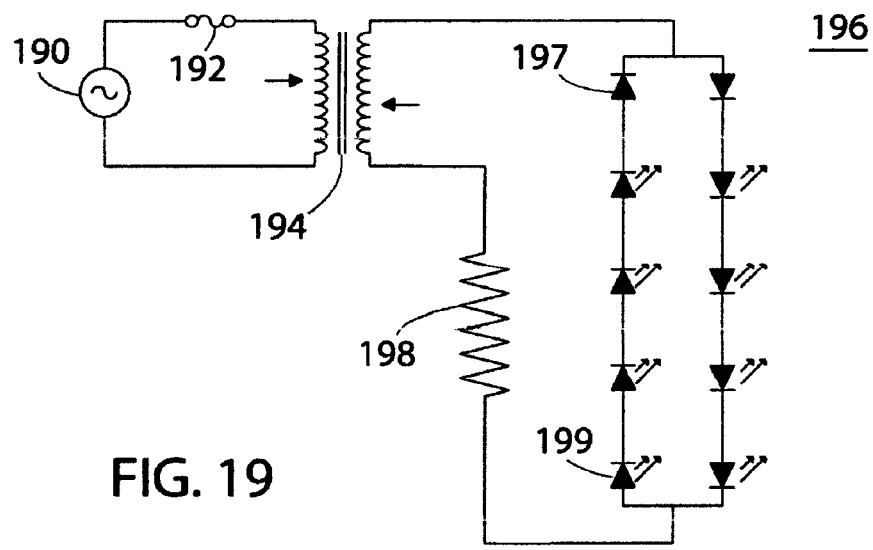
FIG. 19 illustrates a circuit diagram in accordance with another embodiment of the present invention showing an alternative AC LED implementation.

Referring to FIG. 19, another application of the present invention is shown, incorporating 60 Hertz AC power source 190 to directly drive an LED lighting configuration. The AC power source is coupled to LED string assembly 196, through fuse 192, and transformer 194. The transformer is fabricated as an embedded device, utilizing the flexible circuit assembly process described in FIGS. 6 through 15.

LED string 196 is fabricated from diode 197 and LED string 199. Diode 197 provides greater reliability under reverse bias than a standard type light emitting diode. The secondary of transformer 194 is coupled to the LED string assembly, at one end, through current limiting resistor 198, and to the second end of the LED string assembly. The resultant configuration produces an equivalent 120 Hertz effect, thus reducing flicker in the LED lighting application.

Figure 20:
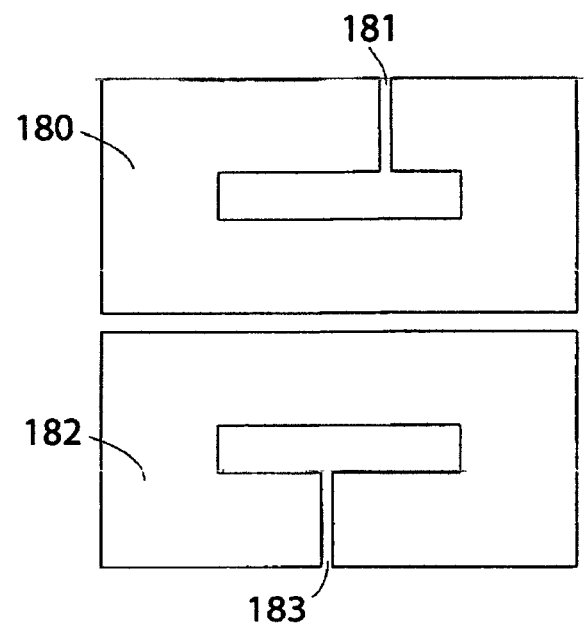
FIG. 20 illustrates a top view of a flexible assembly in accordance with another embodiment of the present invention showing laminated magnetic core elements.

Referring to FIG. 20, magnetic core layer 180, having air gap 181, and magnetic core layer 182, having air gap 183 are configured for stacking and lamination, utilizing the embedded concepts of FIGS. 6 through 15.

Air gaps are known in the art as desirable for reducing DC bias saturation in magnetic core stacks in inductors and transformers. As known in the art, air gaps are stacked coincidentally. However, coincident stacking of air gaps in flexible circuits results in a potentially less stable mechanical structure that is subject to bending and damaging during the manufacturing process.

In FIG. 20, prior to assembly of the magnetic core, air gaps 181 and 183 are laser cut in an offset manner and on opposing sides of the respective magnetic core layers. The resulting laminated stack is thus configured with staggered air gaps located on opposite sides of the respective magnetic core layers. Thus, the adjacent magnetic core layers provide support in the area the of air gaps in the respective adjacent core layers while maintaining the desired impact of the air gap. The resulting laminated core is more stable than a laminated core with coincident air gaps.

Alternatively, the air gaps may be offset in a non-opposing manner, e.g., in quadrature or sequential, and also etched and/or filled with an insulating material.

The magnetic core is formed, for example, by gluing two sheets of steel to form a solid laminate of 0.13 mm thick. This laminate is masked on both sides, patterned and then chemically etched from both sides, using processes known to one skilled in art. The etching of the laminated steel cores result in a structure with an outer dimension of 15×40 mm and an inner dimension of 2.9×28 mm. Air gaps 181 and 183 are also formed in the etching process to a predetermined width of 0.06 mm.

Due to the offset of the air gaps, the resulting steel core can be handled and bent without altering the gap widths.

One skilled in the art would also recognize that more than two layers of metals can be processed to produce enhanced inductance characteristics. For example, with four copper layers, twice the number of windings is formed around the magnetic core thus creating larger inductances and more powerful transformers.

Inductors used in a frequency range below 100 kilohertz are suited for fabrication utilizing laminated steel cores such as shown in the cross-sections of FIGS. 6 through 15. For inductors used in a frequency range of 100 kilohertz to 5 megahertz, a ferrite core is desirable. However, ferrite cores are fragile and prone to breakage when stress, e.g. bending for product fabrication and bending for assembly processing, is applied.

Figure 20A:
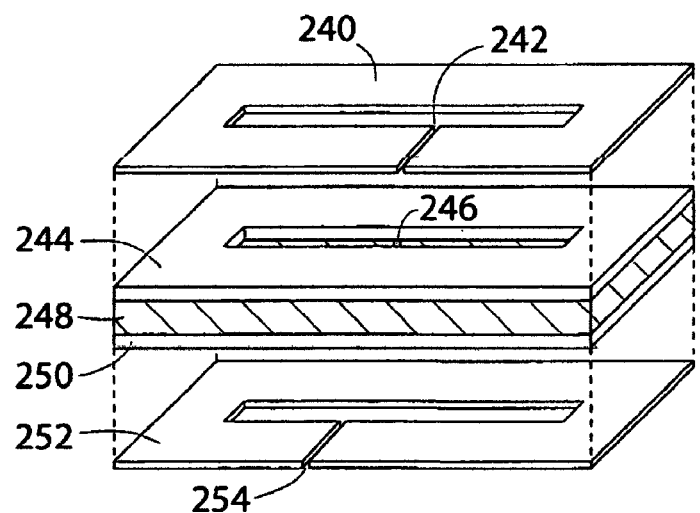
FIG. 20a illustrates an exploded view a flexible assembly showing a ferrite core structure in accordance with another embodiment of the present invention.

Referring to FIG. 20a, the principle of inductor construction, for the flexible circuit assembly of the present invention, is applied to provide a stable and somewhat flexible device configuration. Ferrite core 248, having air gap 246, is sandwiched between steel lamination core layers 240 and 252, the cores having air gaps 242 and 254, respectively. Intervening adhesive layers 244 and 250 provide an attachment mechanism for laminating the steel core layers to the ferrite core layer. Air gaps 242 and 254 are located in a predetermined offset fashion, on the same side of the steel cores for this example. The air gap for the ferrite core is located, in a predetermined position, on the opposite side that of the air gaps for the steel cores so as to provide a balanced degree of stress relief for the laminated ferrite core inductor structure.

For example, the amorphous steel clad core layers each are 0.018 mm thick, the adhesive layers are each 0.025 mm thick, and the ferrite core is 0.135 mm thick. The ferrite core and steel air gaps are cut at 0.04 mm wide. The resulting inductance, when configured as the inductor of FIG. 1, is approximately 20 micro Henries, when operated at frequencies in the low megahertz range.

Figure 21:
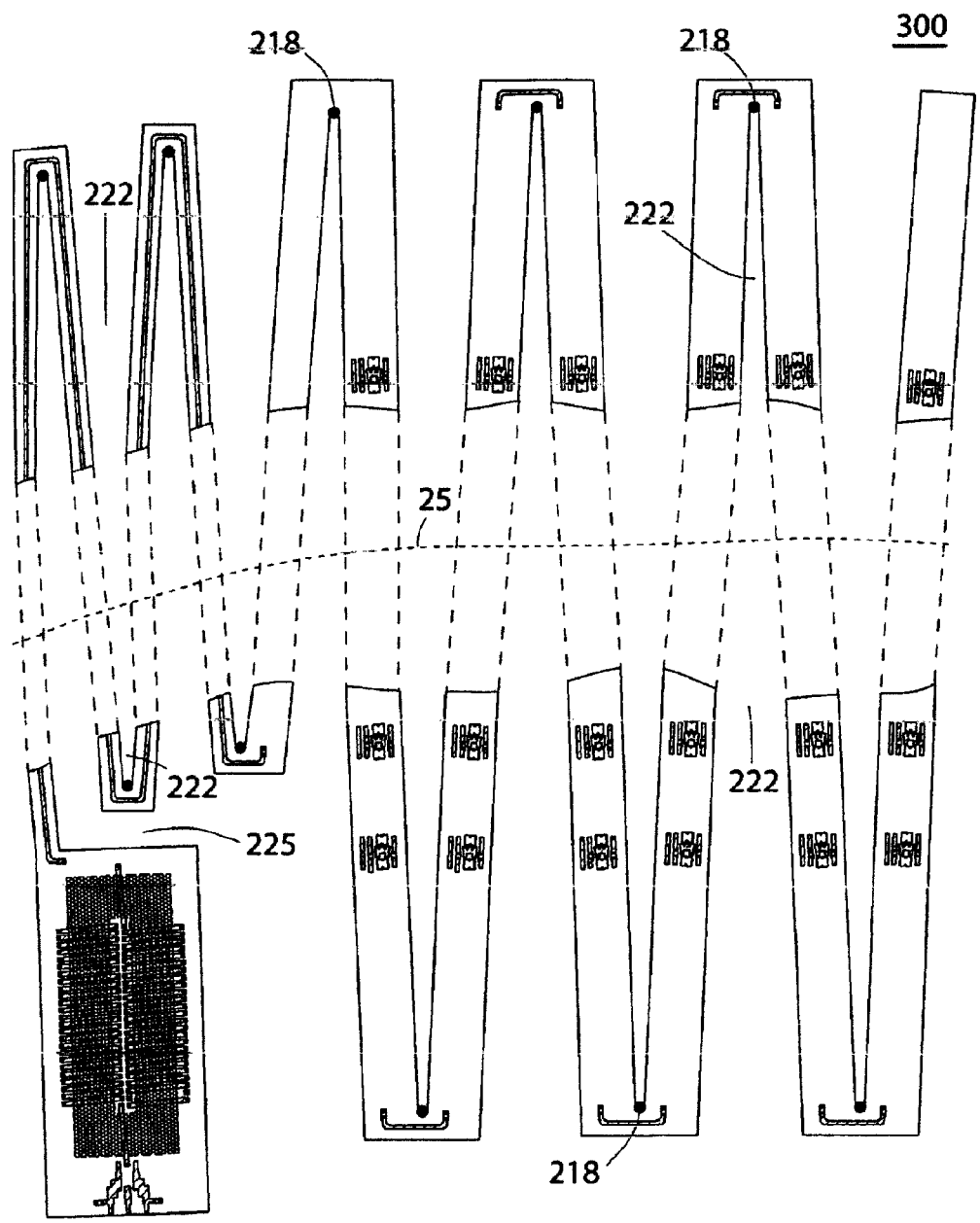
FIG. 21 illustrates a top view in accordance with another embodiment of the present invention showing detail after cutting of the flexible strip assembly to enhance flexibility of the flexible assembly.

Referring to FIG. 21, cuts are made along respective cut lines 212 shown in FIG. 1. In FIG. 1, flexible circuit assembly 30 is, for example, singulated from a roll of multiple assembled flexible assemblies (not shown). Cuts are made along peripheral cut lines 214 in the singulation process. The cuts are made with a router cutting tool or other cutting device as one skilled in the art would recognize. Cuts are next made in a longitudinal direction along cut lines 212. The cuts are terminated at their respective drill openings 218. The drill openings serve as termination points to minimize cutting tool tear-out at the end of the cut lines.

The columns of LED devices and longitudinal metallizations are now slightly separated. To accommodate cutting along lateral cut line 215 to serve as a separation line for inductor area 130.

Referring back to FIG. 21, the cut flexible assembly is now further separated and spread to form post cut longitudinal areas 222 and post cut lateral area 225. The resulting flexible structure 300 is ribbon-like and exhibits a high degree of flexibility, approaching a 360 degree bendable capability and configurable in three dimensions.

Figure 22:
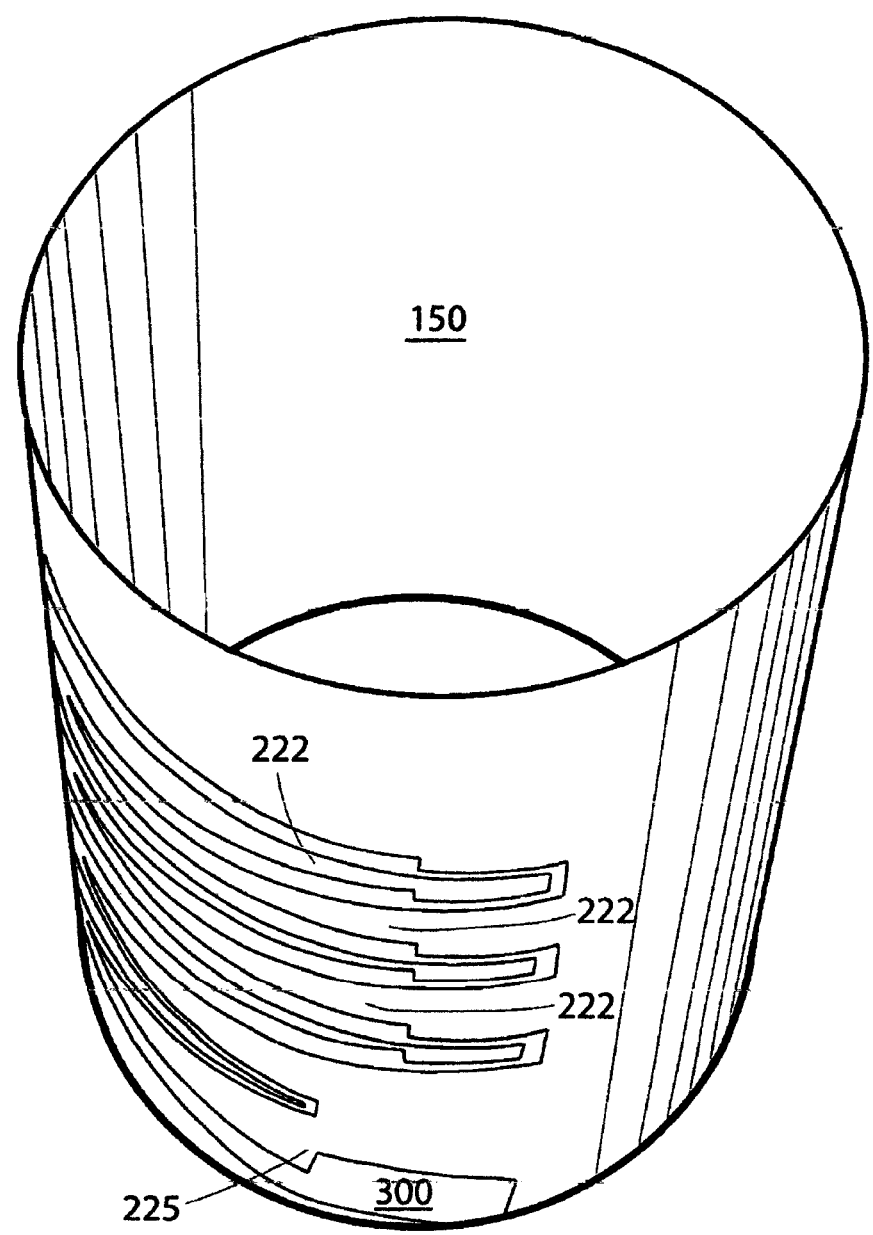
FIG. 22 illustrates an implementation of a flexible assembly in accordance with another embodiment of the present invention applicable to configurable lighting.

Looking now to FIG. 22, flexible structure 300, and from flexible structure 300 of FIG. 21, is affixed to cylindrical canister 150. The attachment mechanism is, for example, but not limited to a mechanical means, e.g., screws or bolts; or adhesive means, e.g., tape, adhesive laminate layer, glue, thermally conductive gel, or epoxy; or hard fixed means, e.g., solder or welding.

For this application the flexible structure-canister combination forms an electric LED lighting device, powered directly by an alternating current (AC) source. The canister further operates to provide a heat sink for the conforming flexible structure. The cylindrical canister is, but not limited to aluminum, copper, brass, or steel. The thickness of the canister material is selected to provide an appropriate heat sinking heat transfer mechanism for the dissipating heat generated by LEDs in the flexible circuit assembly.

Thus, by cutting and then spreading the flexible circuit assembly of FIG. 21, heat generated by the components of the assembly, is likewise spread over a greater area to improve thermal dissipation characteristics of the AC powered, transformer coupled, LED string.

For this example, the total weight of the canister assembly is 112 grams, i.e., 103 grams for the aluminum canister plus 9 grams for the flexible circuit assembly, thus providing an ultra lightweight LED lighting appliance weighing less than ¼ of a pound.

INDUSTRIALIZATION

The present invention is designed for phasing into high volume production. Initially, the flexible circuit assembly is processed in rectangular panels to provide a vehicle to improve and optimize materials, processes, design, test and quality.

Once processes are optimized, manufacturing will transition from panels to roll-to-roll processes. Dielectric films as polyimide, polyester-imide, polyester, impregnated paper and conductive foils of copper, aluminum and steel are available in rolls of 300 mm width and wider.

Combined tools, developed by equipment integrators, are available to cut films, to laminate two or more layers, to print, to chemically etch, and to deposit thin metal on continuous roll of thin films. High speed, automated tools for roll-to-roll manufacturing lines can be further integrated to pick and place components, e.g., magnetic cores and islands.

Additionally, devices, e.g., semiconductors, LEDs, diodes, capacitors, resistors, lenses, and adhesives, encapsulants, thermally conductive gels, and skive, integrate them into roll of laminated, thin films. Near the end of process, roll of embedded electronics are electrically tested, inspected and cut to singulate out complete electronic system like low cost LED lighting. Goal is low cost, thin, flexible, light weight, power electronics for medical, aerospace, automotive, hand-held and other applications.

Thus it can now be appreciated that the present invention provides a method for fabricating a highly flexible circuit assembly by removing material in predetermined locations in an intermediate layer of the assembly.

It can be further appreciated that the present invention provides reduced stress characteristics for devices by locating devices at, or in proximity to, a zero stress plane of the flexible circuit assembly.

It can be even further appreciated that the embedded devices include a three dimensional inductor with magnetic field planes parallel to the plane of the flexible circuit assembly, thus reducing the effects of stray magnetic fields on other devices within the assembly.

It can be still further appreciated that the present invention provides a method for reducing stress within a laminated magnetic core of an inductor embedded in the flexible circuit assembly by locating a brittle ferrite core in proximity to the low stress central plane.

It can be even more so appreciated that the present invention provides a structure for enhanced heat dissipation for embedded devices within the flexible circuit assembly.

It can also be appreciated that the present invention is highly compatible with low cost and automated roll-to-roll manufacturing techniques.

It can additionally appreciated that the present invention combines light weight with conformability for the flexible circuit assembly.

In the foregoing specification, the invention has been described with reference to specific embodiments, to specific materials, to specific processes, and to specific specifications. While specific embodiments of the present invention have been shown and described, further modifications and improvements will occur to those skilled in the art. It is understood that the invention is not limited to the particular forms illustrated, and it is intended for the appended claims to cover all modifications that do not depart from the spirit and the scope of this invention.

I claim:

1. A method of fabricating a laminated inductor core, suitable for embedding in a flexible circuit assembly, comprising the steps of: a) patterning a first magnetic core layer; b) patterning a second magnetic core layer; c) forming said first magnetic core layer; d) forming said second magnetic core layer; e) forming an air gap in said first magnetic core layer; f) forming an air gap in said second magnetic core layer, wherein said air gap in said second magnetic core layer is offset from said air gap in said first magnetic core layer; and g) laminating said first and second magnetic core layers.

2. The method of fabricating a laminated inductor core as recited in claim 1, wherein said laminating of said first and second magnetic core layers is performed prior to the steps said forming of said first and second magnetic core layers, and after the steps of said patterning of said first and second magnetic core layers.

3. The method of fabricating a laminated inductor core as recited in claim 1, wherein said forming of said first and second magnetic core layers is performed by etching.

4. The method of fabricating a laminated inductor core as recited in claim 1, wherein said forming of said first and second magnetic core layers is performed by laser cutting.

5. The method of fabricating a laminated inductor core as recited in claim 1, wherein said forming of said air gaps for said first and second magnetic core layers is performed by laser cutting.

6. The method of claim 1, further including:
patterning a third magnetic core layer;
forming said third magnetic core layer; and wherein laminating said first and second magnetic core layers includes laminating the third magnetic core wherein said third magnetic core layer is sandwiched between said first and second magnetic core layers.

7. The method of fabricating a laminated inductor core as recited in claim 6, wherein said forming of said first, second, and third magnetic core layers is performed by laser cutting.

8. The method of fabricating a laminated inductor core as recited in claim 6, wherein said third magnetic core layer is a ferrite core layer.

9. The method of fabricating a laminated inductor core as recited in claim 6, further comprising the step of forming an air gap in said third magnetic core layer.

10. A flexible circuit assembly, with an embedded inductor device, comprising: a flexible circuit assembly having an intermediate layer having an opening configured for receiving an inductor core, said intermediate layer having a first and second surface; a first structure having a first layer and a second layer, said first structure having an opening to facilitate the embedding of said inductor core, said first structure having intervening layers between said first layer and said second layer, wherein one of said intervening layers of said first structure is configured for providing a plurality of top windings for said inductor core; a second structure having a first layer and a second layer, said first layer of said second structure affixed to said second surface of said intermediate layer, said second structure having intervening layers between said first layer and said second layer, wherein one of said intervening layers of said second structure is configured for providing a plurality of bottom windings for said inductor core; said inductor core affixed to said first surface of said intermediate layer through said through said opening of said first structure and through said opening of said intermediate layer; said first layer of said first structure affixed to said first surface of said intermediate layer; said flexible circuit assembly having a plurality of plated vias passing through said first structure, said intermediate layer, and said second structure for coupling said plurality of top windings and to said plurality of bottom windings to provide inductor loops for said inductor core to complete the embedded inductor device; and said top windings and said bottom windings further configured for coupling to an input signal and to an output signal of said embedded inductor device.

11. A circuit for powering a light emitting diode (LED) with an alternating current, comprising: a plurality of light emitting diode pairs coupled in a serial configuration, each of said light emitting diode pairs having a first diode, said first diode having an anode and a cathode, each of said light emitting diode pairs having a second diode, said second diode having an anode and a cathode, wherein said cathode of said first diode is coupled to said anode of said second diode, wherein said cathode of said second diode is coupled to said anode of said first diode; a first light emitting diode pair having an input at a juncture of said first diode anode and said second diode cathode; a second light emitting diode pair have an input at a juncture of said first diode cathode and said second anode cathode, a remainder of said plurality of said light emitting diode pairs coupled between said first light emitting diode pair and said second light emitting diode pair; a transformer having a first output coupled to said input of said first light emitting diode pair and a second output coupled to said input of said second light emitting diode pair; and said transformer having a first input and a second input, said first and second inputs configured for coupling to an alternating current source.

12. The circuit for powering light emitting diodes (LED) with an alternating current of claim 11, wherein said plurality of said light emitting diode pairs is a single diode pair.

13. The circuit for powering light emitting diodes (LED) with an alternating current of claim 11, wherein said light emitting diodes and said transformer are integrated into a flexible circuit assembly.

14. A circuit for powering a light emitting diode (LED) with an alternating current, comprising: a first light emitting diode string comprising a plurality of light emitting diodes coupled in an cathode to anode configuration, said first light emitting diode string having an anode end and a cathode end; a first diode having an anode coupled to said cathode end of said light emitting diode string, said first diode having a cathode; a second light emitting diode string comprising a plurality of light emitting diodes coupled in an cathode to anode configuration, said second light emitting diode string having an anode end and a cathode end; a second diode having an cathode coupled to said anode end of said second light emitting diode string, said first diode having an anode; a transformer having a first output coupled to said cathode of said first diode and to said anode of said second diode, said transformer having a second output coupled to said anode end of said first light emitting diode string and to said cathode of said second diode; and said transformer having a first input and a second input, said first and second inputs configured for coupling to an alternating current source.

15. The circuit for powering light emitting diodes (LED) with an alternating current of claim 14, wherein said light emitting diodes and said transformer are integrated into a flexible circuit assembly.

\* \* \* \* \*